(12) United States Patent
Tokuhiro et al.

(10) Patent No.: US 10,256,798 B2
(45) Date of Patent: Apr. 9, 2019

(54) TEST METHOD OF DELAY CIRCUIT INCLUDING DELAY LINE

(71) Applicant: FUJITSU LIMITED, Kawasaki-shi (JP)

(72) Inventors: Noriyuki Tokuhiro, Kawasaki (JP); Masazumi Maeda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 151 days.

(21) Appl. No.: 15/344,722

(22) Filed: Nov. 7, 2016

(65) Prior Publication Data

US 2017/0163250 A1 Jun. 8, 2017

(30) Foreign Application Priority Data

Dec. 2, 2015 (JP) .................... 2015-235659

(51) Int. Cl.
*G01R 31/28* (2006.01)
*H03K 5/13* (2014.01)
(Continued)

(52) U.S. Cl.
CPC ......... *H03K 5/133* (2013.01); *G01R 31/2882* (2013.01); *H03K 2005/0015* (2013.01); *H03K 2005/00058* (2013.01)

(58) Field of Classification Search
CPC .... G01R 31/318547; G01R 31/318552; G01R 31/318566; G01R 31/318594; G01R 31/3187; G01R 31/3191; G01R 31/31937; G01R 31/44; G01R 31/31725; G01R 31/3016; G01R 31/318577; G01R 31/3177; G01R 31/31858; G01R 25/005; G01R 31/2849; G01R 31/2856; G01R 31/2882; G01R 31/31701; G01R 31/31708; G01R 31/3171; G01R 31/31715; G01R 31/31716; G01R 31/3172; G01R 31/31721; G01R 31/31727; G01R 31/31816; G01R 31/318544; H03K 2005/00058; H03K 5/133; H03K 5/135; H03K 5/14; H03K 19/003; H03K 19/0966; H03K 2005/00097; H03K 3/011; H03K 3/0315; H03K 3/037; H03K 3/0375; H03K 2005/00019; H03K 2005/0011; H03K 2005/0015; H03K 5/13; H03K 5/131; H03K 5/15; H03K 5/24; H03K 19/00323; H04L 7/0041; H04L 5/0028; H04L 7/0012; H04L 5/0023;
(Continued)

(56) References Cited

U.S. PATENT DOCUMENTS

| 5,942,937 A * | 8/1999 | Bell | ........................ | H03K 5/08 327/270 |
| 7,542,862 B2 * | 6/2009 | Singh | ................. | G01R 31/2874 702/79 |

(Continued)

FOREIGN PATENT DOCUMENTS

| JP | 2000-285144 | 10/2000 |
| JP | 2003-60489 | 2/2003 |
| JP | 2013-152249 | 8/2013 |

*Primary Examiner* — Vinh P Nguyen
(74) *Attorney, Agent, or Firm* — Fujitsu Patent Center (57) ABSTRACT

A delay circuit includes: a delay line that delays an input signal in accordance with a delay setting signal and performs output of the input signal as a delayed signal; and a logic circuit processes the input signal to the delay line and the delayed signal.

6 Claims, 11 Drawing Sheets

(51) Int. Cl.
*H03K 5/133* (2014.01)
*H03K 5/00* (2006.01)

(58) Field of Classification Search
CPC ............... G06F 17/5031; G06F 17/505; G06F 17/5059; G06F 2217/84; G06F 1/10; G06F 2205/104; H03M 1/10; H03L 7/0814; H03L 7/0812; H03L 7/0891; H03L 7/0997; H03L 7/183; H03L 7/00; H03L 7/07; H03L 7/0805; H03L 7/0807
See application file for complete search history.

(56) References Cited

U.S. PATENT DOCUMENTS

| | | | | |
|---|---|---|---|---|
| 2007/0005285 A1* | 1/2007 | Owens | ............. | G01R 31/31725 702/118 |
| 2009/0302917 A1* | 12/2009 | Okamoto | ........... | G01R 31/3016 327/231 |
| 2014/0375329 A1* | 12/2014 | Van De Graaff | ............................ | G01R 31/31725 324/511 |

* cited by examiner

FIG. 7A
Duty =70%

FIG. 7B
Duty =30%

FIG. 7C
Duty =50%

TEST METHOD OF DELAY CIRCUIT INCLUDING DELAY LINE

CROSS-REFERENCE TO RELATED APPLICATION

This application is based upon and claims the benefit of priority of the prior Japanese Patent Application No. 2015-235659, filed on Dec. 2, 2015, the entire contents of which are incorporated herein by reference.

FIELD

The embodiments discussed herein are related to a delay circuit and a test method of the delay circuit.

BACKGROUND

Recently, a large number of delay lines is used for timing adjustment and the like in a semiconductor device. For example, a double data rate (DDR) is known as a standard for connecting a central processing unit (controller) and an external memory (DIMM), and standards such as a DDR2, a DDR3, and a DDR4 have been developed in keeping with a higher speed of data transfer.

In the DDR standard, strict timing specifications have been defined for various electrical signals exchanged with a memory when reading data from a memory and writing data to a memory. In addition, a variance within a certain range is assumed in a timing in which a signal is received from the memory. In a semiconductor device that operates in accordance with the DDR standard, a large number of delay lines are used in a memory controller in order to finely adjust a timing of an electrical signal.

In the delay line, a large number of buffer circuits (delay elements), each of which causing a minute delay, are provided so as to be connected in series, such that a desired delay amount is obtained by adjusting the number of buffer circuits connected (passed through). A delay amount of one delay element corresponds to a resolving power to set delay for a delay line. In order to set a delay amount with a high degree of accuracy, a delay amount for each of the delay elements is set to a small value. To obtain a large maximum delay amount, the number of connected delay elements is increased. Thus, a high accuracy delay line with a large maximum delay amount involves a complex circuit and an increased circuit scale.

The delay line is a circuit that outputs an input signal after delaying the signal for a certain amount of time. The delay line is thus a buffer (or inverter) logically. In an inspection for shipping, etc., not only a logical test of the delay line, but also a reasonableness test of a delay (accuracy of a delay amount per stage of a delay element) is called for.

A method using a scan circuit is known as a method for measuring a delay amount. However, a delay amount and setting resolution desired for a delay line are very small values compared to a clock cycle of a circuit, making it difficult to measure a delay in a delay line accurately.

For the reasons described above, there is an issue of a failure being difficult to detect if bits adjacent to each other in a delay line delay setting signal are short-circuited. This is because it is difficult to detect a difference between delay setting signals next to each other, as the difference of the amount of delay to be set is still small. There are other types of failures in a delay line, and it is desirable that a delay is accurately measured in each case.

The followings are reference documents.
[Document 1] Japanese Laid-open Patent Publication No. 2000-285144,
[Document 2] Japanese Laid-open Patent Publication No. 2013-152249, and
[Document 3] Japanese Laid-open Patent Publication No. 2003-60489.

SUMMARY

According to an aspect of the invention, a delay circuit includes: a delay line that delays an input signal in accordance with a delay setting signal and performs output of the input signal as a delayed signal; and a logic circuit processes the input signal to the delay line and the delayed signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An explanation follows, regarding a general delay line with reference to drawings before describing a delay line according to an embodiment.

Figure 1:
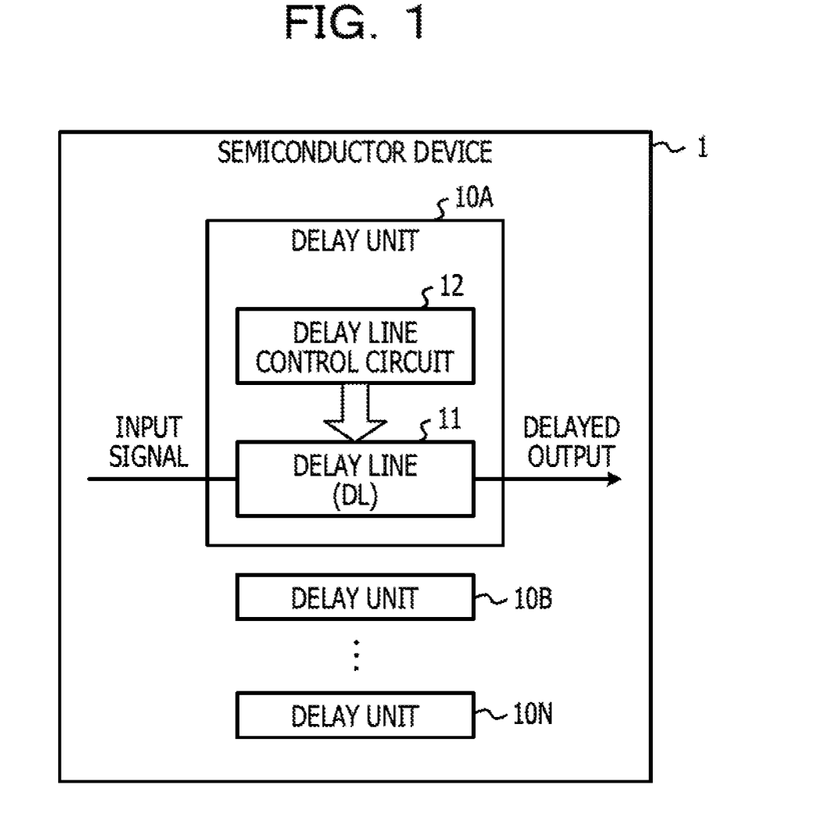
FIG. 1 is a block diagram illustrating a semiconductor device including delay lines.

FIG. 1 is a block diagram illustrating a semiconductor device including delay lines.

As illustrated in FIG. 1, a delay line 11 is used combined with a delay line control circuit 12 that generates a delay setting signal to be output to the delay line 11. Here, a part including the delay line 11 and delay line control circuit 12 is referred to as a delay circuit (delay unit).

As illustrated in FIG. 1, a semiconductor device 1 includes a large number of delay units 10A to 10N. Hereinafter, one delay unit may be referred to as a delay unit 10. In the delay unit 10, the delay line 11 delays an input signal by the delay amount set by the delay line control circuit 12 and outputs the input signal as a delayed signal.

Figure 2A:
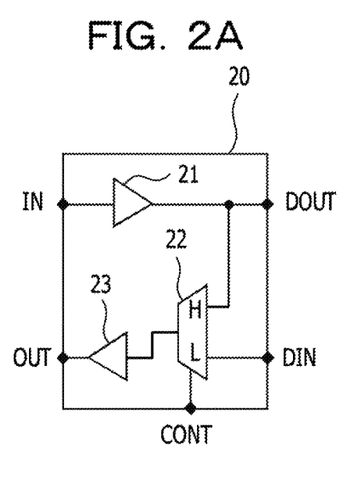
FIGS. 2A to 2D are diagrams each illustrating a configuration example of the delay line.
Figure 2B:
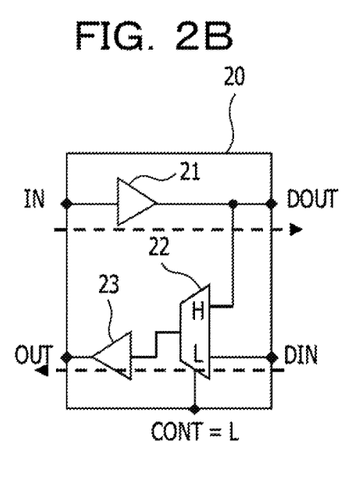
Figure 2C:
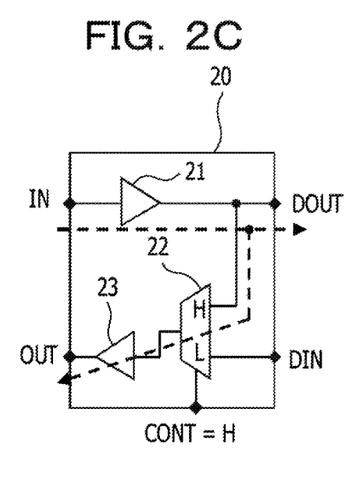
Figure 2D:
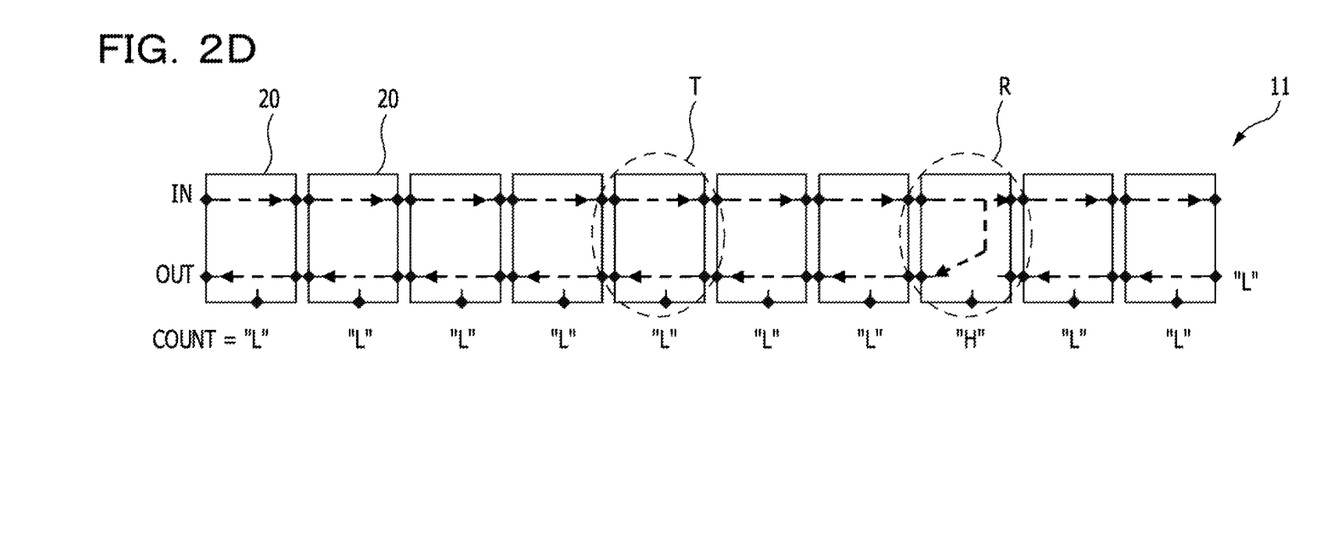

FIG. 2A to 2D are diagrams each illustrating a configuration example of the delay line. As illustrated in FIG. 2D, the delay line 11 is formed by connecting a large number of delay elements 20 in series. Each of the delay elements 20 has a configuration as illustrated in FIG. 2A. The delay element 20 includes a buffer 21, a selector 22, and a buffer 23. The buffer 21 delays a signal IN from the preceding stage and outputs a signal DOUT to the following stage. The selector 22 selects one out of the signal output from the buffer 21 and a signal DIN from the following stage according to a control signal CONT. The buffer 23 delays a signal output from the selector 22 and outputs a signal OUT to the preceding stage. Generally, the buffers 21 and 23 are respectively implemented by two inverters connected in series. The selector 22 is implemented by two transfer gates. The delay element 20 may be implemented by using an inverter instead of the buffer, and using an NAND gate or the like instead of the selector.

As illustrated in FIG. 2B, when the control signal is set to "CONT=L (low)", the selector 22 selects and outputs the signal DIN from the following stage. Thus, as indicated by the broken line, the delay element 20 in this state adopts a through operation state in which the signal IN from the preceding stage is passed through the buffer 21 and output to the following stage, and the signal DIN from the following stage is passed through the selector 22 and the buffer 23 and output to the preceding stage.

As illustrated in FIG. 2C, when the control signal is set to "CONT=H (high)", the selector 22 selects and outputs a signal output from the buffer 21. Thus, as indicated by the broken line, the delay element 20 in this state adopts a feedback operation state in which the signal IN from the preceding stage is passed through the buffer 21, the selector 22, and the buffer 23 and output to the preceding stage.

As illustrated in FIG. 2D, in the delay line 11, out of the large number of delay elements 20 connected in series, only in one delay element 20 the control signal CONT becomes "H", and the control signals CONT for the other delay elements are "L". As illustrated in FIG. 2D, in the delay line 11, it is assumed that the control signal is set to "CONT=H (high)" for a delay element 20 at the eighth stage, and the control signal is set to "CONT=L (low)" for the other delay elements 20. In this case, the delay elements 20 at the first to seventh stages are in the through operation state, and the signal input to the first stage reaches the delay element 20 in the eighth stage, where the signal is fed back toward the first stage and output from the first stage as a signal OUT. In this case, the signal input to the first stage is delayed by a delay time corresponding to eight stages, specifically a delay time due to passing through 8×2 buffers and one selector. Thus, a position at which the signal is fed back is determined by specifying the stage number for the stage for which the control signal CONT is set to "H", thereby setting a delay time.

A control signal CONT for the delay element 20 that forms the delay line 11 is generated by the delay line control circuit 12. For example, delay setting data that specifies the delay amount in the delay line 11 to which 1024 stages of delay elements are connected, is data of 10 bits. The delay line control circuit 12 decodes the delay setting data of 10 bits, and sets one of the 1024 control signal lines to "H" and sets the other control signal lines to "L"

A general delay line has been described above. However, various configurations of delay lines other than the configuration illustrated in FIG. 2 are known, and the delay circuit (delay unit) according to the embodiment is not limited to the form of the delay line.

When a delay line is employed, generally, value of delay setting data is increased or decreased by one, such that a desired delay amount is obtained in the delay line. Therefore, when manufacturing a semiconductor device including a delay line, a large number of delay elements that form the delay line are produced such that all delay elements exhibit the same characteristic, namely, the same delay time. Thus, by increasing or decreasing the value of delay setting data by one, a delay amount of the delay line changes accordingly in units of one unit.

In the manufacturing process of the semiconductor device including the delay line, it is desired that a test is performed as to how a delay amount of the delay line changes against a change in a value of delay setting data. However, a delay amount per stage of a delay line provided in a memory controller that conforms to the DDR4 standard is approximately 2 ps to 5 ps, which is very small compared to a clock cycle of the circuit. Therefore it is very difficult to test the delay amount in a delay line. In the embodiments described below, a delay circuit that allows a delay to be measured accurately and a test method thereof are provided.

Figure 3:
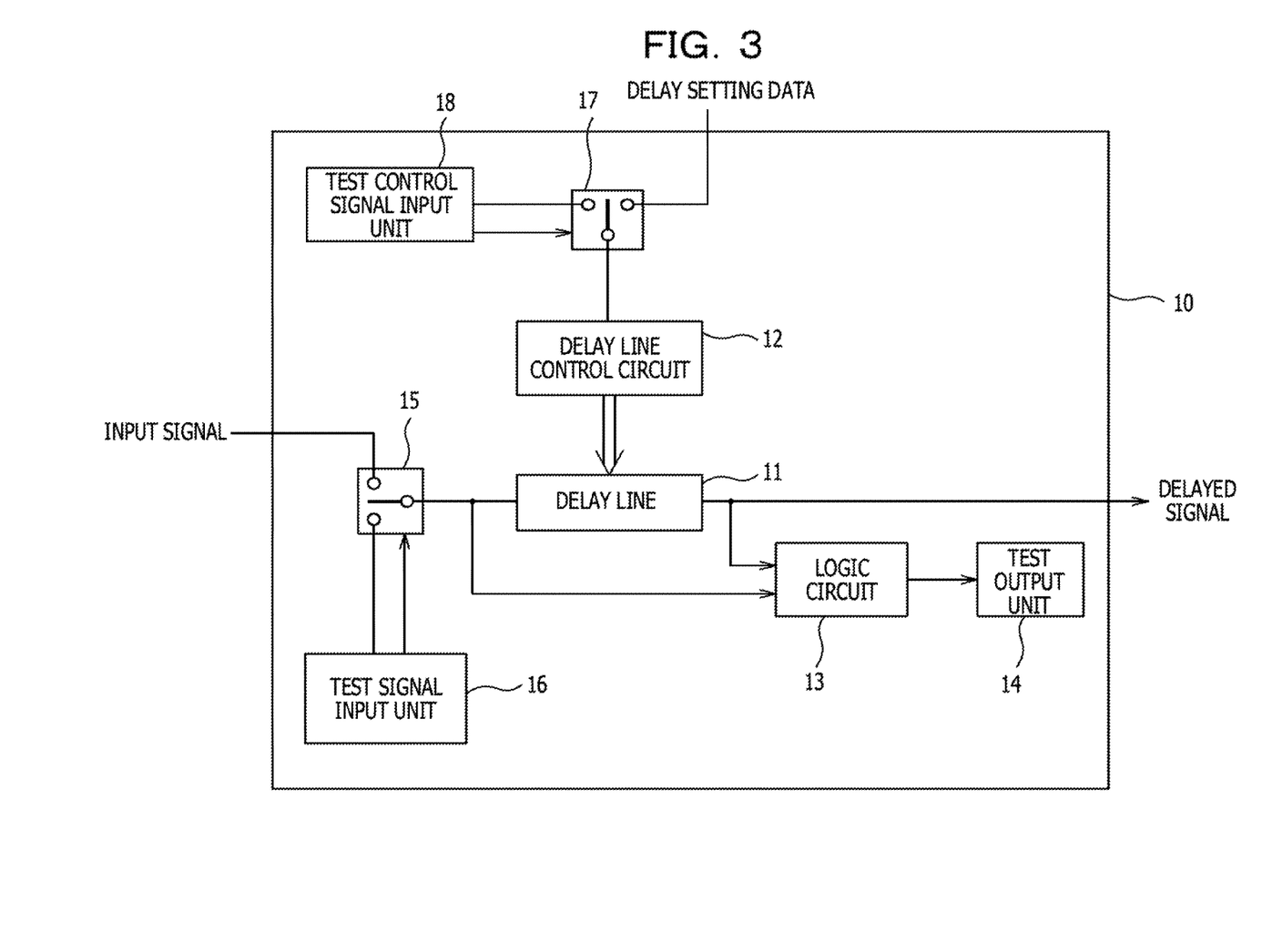
FIG. 3 is a diagram illustrating a configuration of a delay unit (delay circuit) according to an embodiment.

FIG. 3 is a diagram illustrating a configuration of the delay unit (delay circuit) according to the embodiment. The delay unit 10 according to the embodiment includes a logic circuit 13 in addition to a delay line 11 and a delay line control circuit 12. The delay unit 10 according to the embodiment further includes a test output unit 14, a switch 15, a test signal input unit 16, a switch 17, and a test control signal input unit 18.

The logic circuit 13 processes an input signal to the delay line 11 and a delayed signal that has been delayed by the delay line 11. The logic circuit is, for example, either one of an EXOR circuit, an EXNOR circuit, an OR circuit, an NOR circuit, an AND circuit, and a NAND circuit.

The switch 15 selects an input signal at normal operation, and when the delay unit 10 is tested, the switch 15 selects a test signal input from the test signal input unit 16, and outputs the selected signal to the delay line 11 as an input signal.

The switch 17 selects delay setting data at normal operation, and when the delay unit 10 is tested, the switch 17 selects a test control signal input from the test control signal input unit 18, and outputs the selected signal to the delay line control circuit 12 as a delay setting data.

The test output unit 14 is a unit that externally outputs a logical signal that is a test result output from the logic circuit 13.

It is intended that the delay unit 10 according to the embodiment illustrated in FIG. 3 measures a delay amount in the delay line 11 against the delay setting data, in the manufacturing process of the semiconductor device 1 to which the delay unit 10 is provided. The test signal input unit 16, the test control signal input unit 18, and the test output unit 14 are electrode pads of the semiconductor device 1, and each of the units includes one or more electrode pads, which is contacted by a probe of a tester that inspects the semiconductor device (chip) on a wafer. A test signal and a test control signal are output from the tester, and a signal output from the test output unit 14 is input to the tester. In addition, the switch 15 is in a state in which an input signal is selected at normal operation, and when the tester probe contacts the test signal input unit 16, the switch 15 performs a switching so as to select a test signal input from the test signal input unit 16. Similarly, the switch 17 is in a state in which a delay setting data is selected at normal operation, and when the tester probe contacts the test control signal input unit 18, the switch 17 performs a switching so as to select a test control signal input from the test control signal input unit 18.

Note that the test output unit 14, the test signal input unit 16, and the test control signal input unit 18 illustrated in FIG. 3 are examples, and instead of providing these, an existing external terminal of the semiconductor device 1 may be used for input/output of a test signal and a test control signal. In addition, a test signal and a test control signal may be generated using a circuit provided to the semiconductor device 1 without providing the switch 15 and the switch 17.

Figure 4:
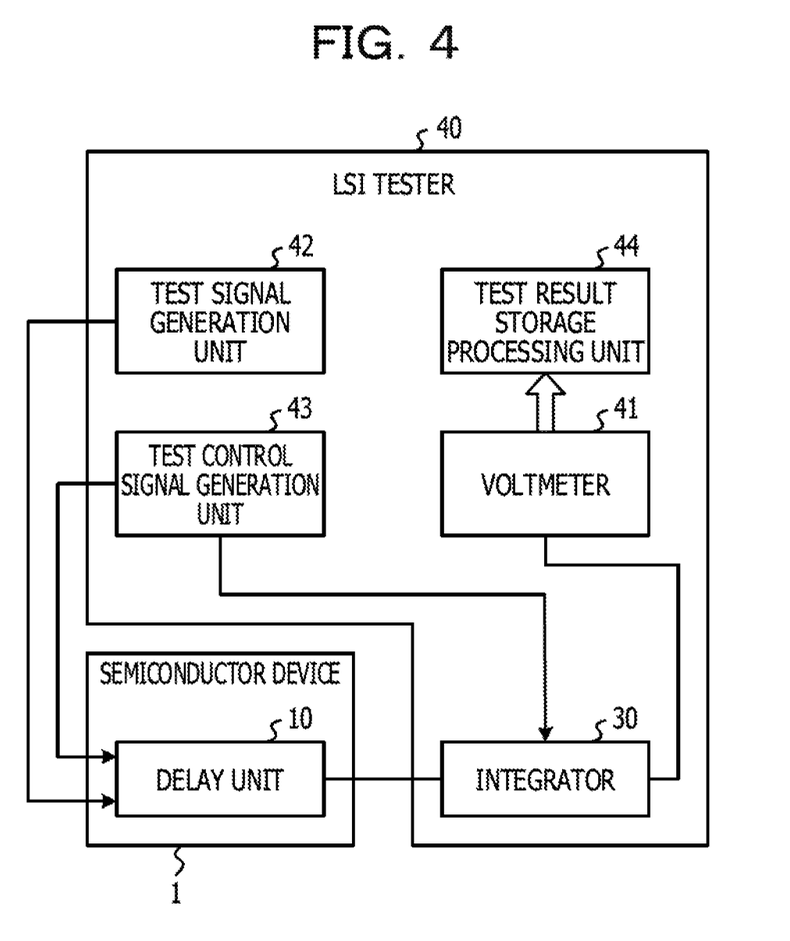
FIG. 4 is a diagram illustrating a configuration of a test system that tests a delay amount of the delay unit according to the embodiment provided in a semiconductor device.

FIG. 4 is a diagram illustrating a configuration of a test system that tests a delay amount in the delay unit according to the embodiment provided in the semiconductor device.

As described above, the test system uses a LSI tester 40 that is used in the manufacturing process of the semiconductor device 1. The LSI tester 40 includes an integrator 30, a voltmeter 41, a test signal generation unit 42, a test control signal generation unit 43, and a test result storage processing unit 44. Note that the integrator 30 may be provided externally at an appropriate position between the probe and the LSI tester main body, or inside the semiconductor device.

The test signal generation unit 42 generates a test signal described later, and supplies the test signal to the delay line 11 through the probe and the test signal input unit 16 of the delay unit 10. The test control signal generation unit 43 generates delay setting data increased or decreased in units of one unit, and supplies the delay setting data to the delay line control circuit 12 through the probe and the test control signal input unit 18 of the delay unit 10. The integrator 30 receives an output of the logic circuit 13 of the delay unit 10 through the test output unit 14 and the probe, and integrates the outputs for a given time period. The voltmeter 41 measures a voltage value of the integrator 30 and supplies the voltage value to the test result storage processing unit 44. The test result storage processing unit 44 stores a voltage value corresponding to each value of the delay setting data, and executes processing in which a change in a voltage value against a change in the delay setting data, namely, a status of change in a delay amount is judged.

Figure 5A:
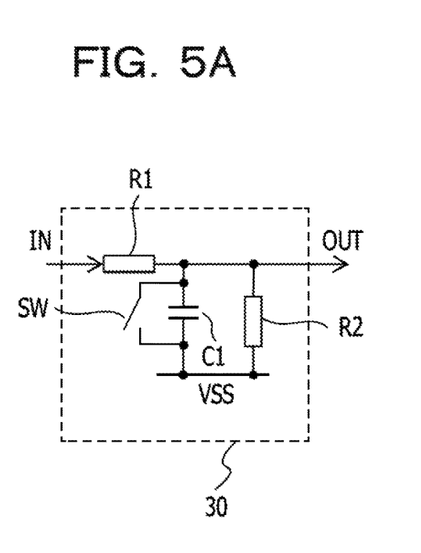
FIGS. 5A and 5B are diagrams each illustrating a configuration example of an integrator.
Figure 5B:
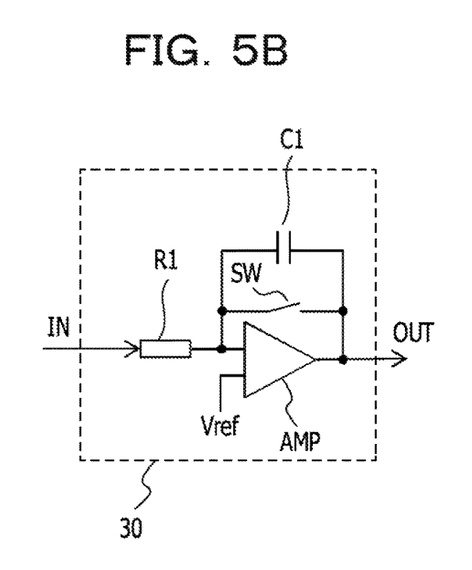

FIGS. 5A and 5B are diagrams each illustrating a configuration example of an integrator. FIG. 5A illustrates an integrator circuit including resistors R1 and R2, a capacity C1, and a switch SW. FIG. 5B illustrates an integrator circuit including a difference amplifier AMP, a resistor R1, a capacity C1, and a switch SW. The integrator circuits are widely known, so that the descriptions are omitted herein.

Figure 6:
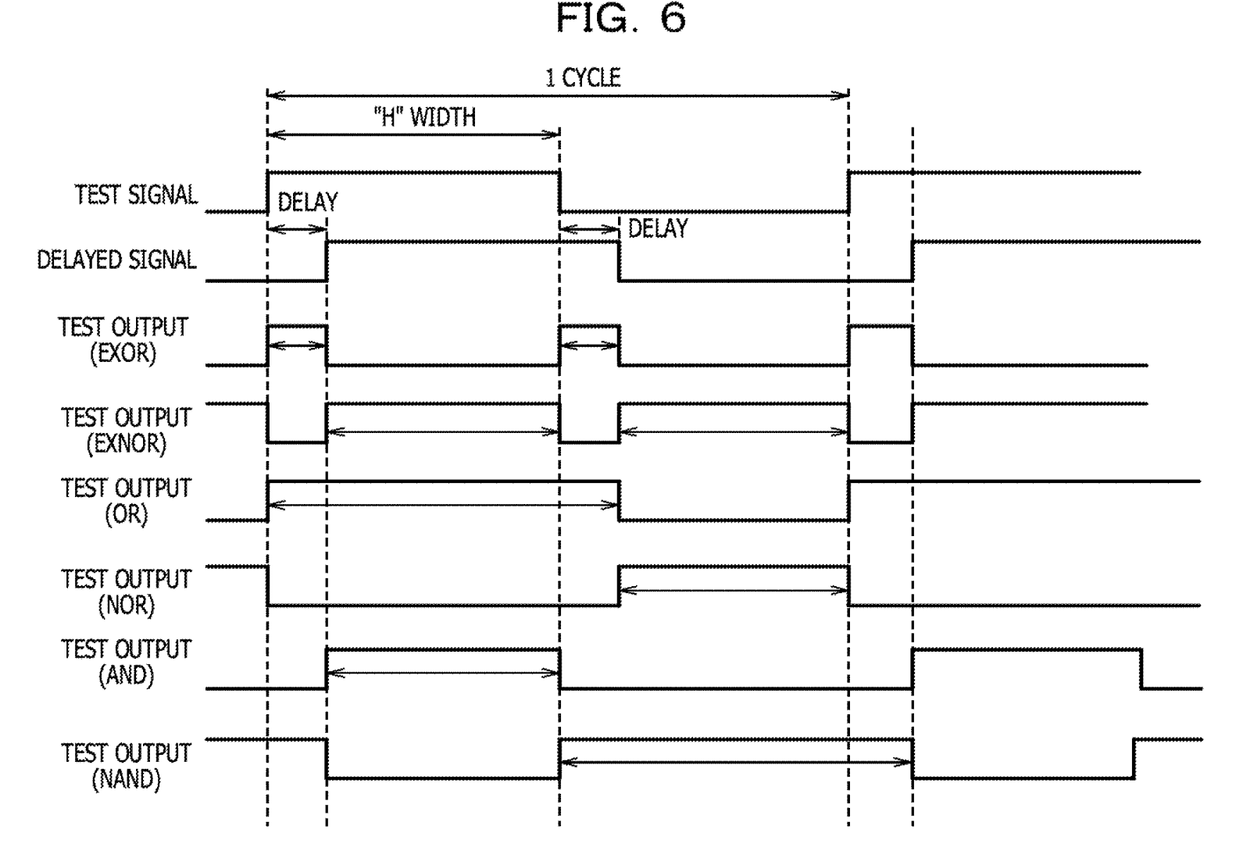
FIG. 6 is a time chart illustrating a waveform of a test signal, a delayed signal, and a test output which is output from a logic circuit 13.

FIG. 6 is a time chart illustrating a waveform of a test signal, a delayed signal, and a test output which is output from the logic circuit 13.

The test signal is a cycle signal that changes between "H" and "L", and the duty ratio is approximately 50%, and one cycle length of the test signal is twice or more the maximum delay amount of the delay line 11.

A delayed signal output from the delay line 11 is a test signal shifted by the amount of delay. As described above, the one cycle length of the test signal is twice or more the maximum delay amount of the delay line 11, thus, the rising edge of the delayed signal does not exceed the falling edge of the test signal.

The six signals are respectively a test output of the logic circuit 13 when the logic circuit 13 is an EXOR circuit, an EXNOR circuit, an OR circuit, a NOR circuit, an AND circuit, and a NAND circuit. In one cycle of a test signal, the H pulse width of the EXOR test output is delay amount×2. The H pulse width of the EXNOR test output is "one cycle of test signal−delay amount×2". The H pulse width of the OR test output is "H width of test signal+delay amount". The H pulse width of the NOR test output is "(cycle of test signal−H width of test signal)−delay amount". The H pulse width of the AND test output is "H width of test signal−delay amount". The H pulse width of the NAND test output is "(cycle of test signal−H width of test signal)+delay amount".

Thus, in any one of the logic circuits, the cycle of the test output is equal to the cycle of the test signal, and the H width is proportional to the delay amount. The duty ratio of the test output is a value obtained by dividing the H width by the cycle of the test signal. The voltage of the integrator 30 is proportional to duty ratio of the test output (namely, delay amount) and the number of repetitions (time) of the test signal, respectively. Therefore, a delay amount may be detected by measuring the voltage of the integrator 13 after having supplied a test signal of a given number of cycles, after connecting the switch of the integrator, resetting the voltage of the integrator, and cutting off the switch. The deterioration is smaller when one signal is output outside the semiconductor device 1 with the duty ratio of the signal maintained, compared to a case in which two signals are output outside the semiconductor device 1 with the delay relationships between the two signals maintained or a delay amount of a few ps is measured. In the integrator 13, charge leakage is little in a short time, and the voltage is accurately proportional to the duty ratio of the test output. The voltmeter 41 is capable of measuring the voltage with a resolution of from one few-thousandth to one ten-thousandth, so that a delay amount per stage may be measured with sufficient accuracy in delay lines of approximately 1000 stages.

Figure 7A:
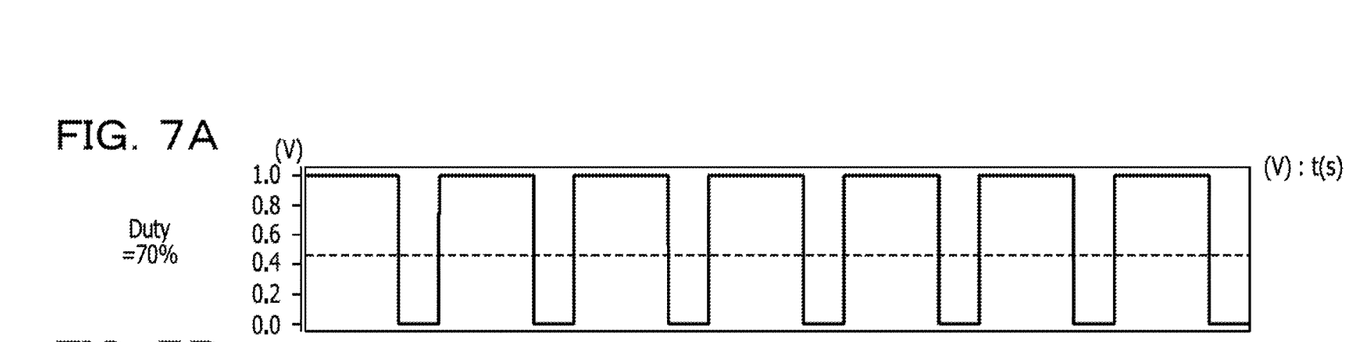
FIGS. 7A to 7C are diagrams each illustrating a test output when the integrator is used and a voltage value of the integrator illustrated in FIG. 5A.
Figure 7B:
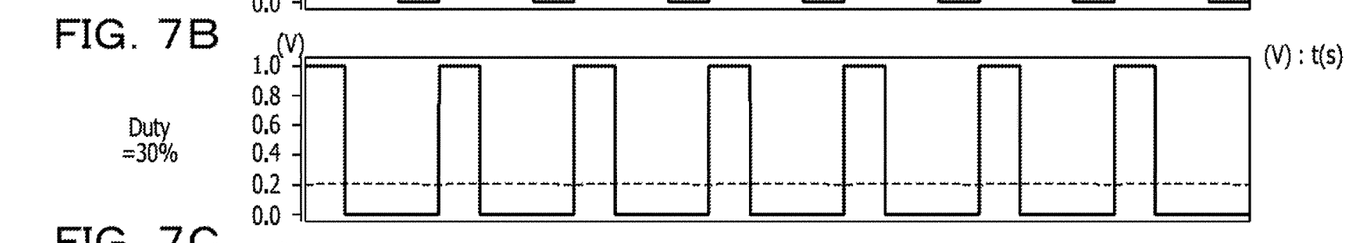
Figure 7C:
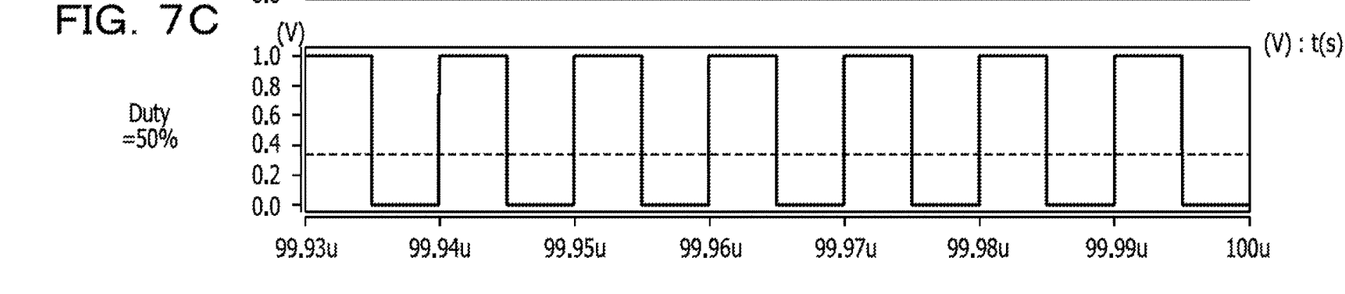

FIGS. 7A to 7C are diagrams illustrating a test output and a voltage value of the integrator illustrated in FIG. 5A when the integrator is used.

In the integrator of FIG. 5A, in relation to a resistance value ratio between the resistors R1 and R2, when the test output is input to the input IN after resetting, the output voltage OUT increases. Then the increase amount becomes smaller gradually and is saturated at a certain value corresponding to the duty ratio of the test output. Each of FIGS. 7A to 7C illustrates an example of a test output (solid line) and voltage (dotted line) of the integrator in a state in which the voltage of the integrator is saturated.

FIG. 7A illustrates a case of duty ratio=70%, FIG. 7B illustrates a case of duty ratio=30%, and FIG. 7C illustrates a case of duty ratio=50%. It is indicated that the voltage of the integrator is saturated, and the voltage value is proportional to the duty ratio.

Figure 8:
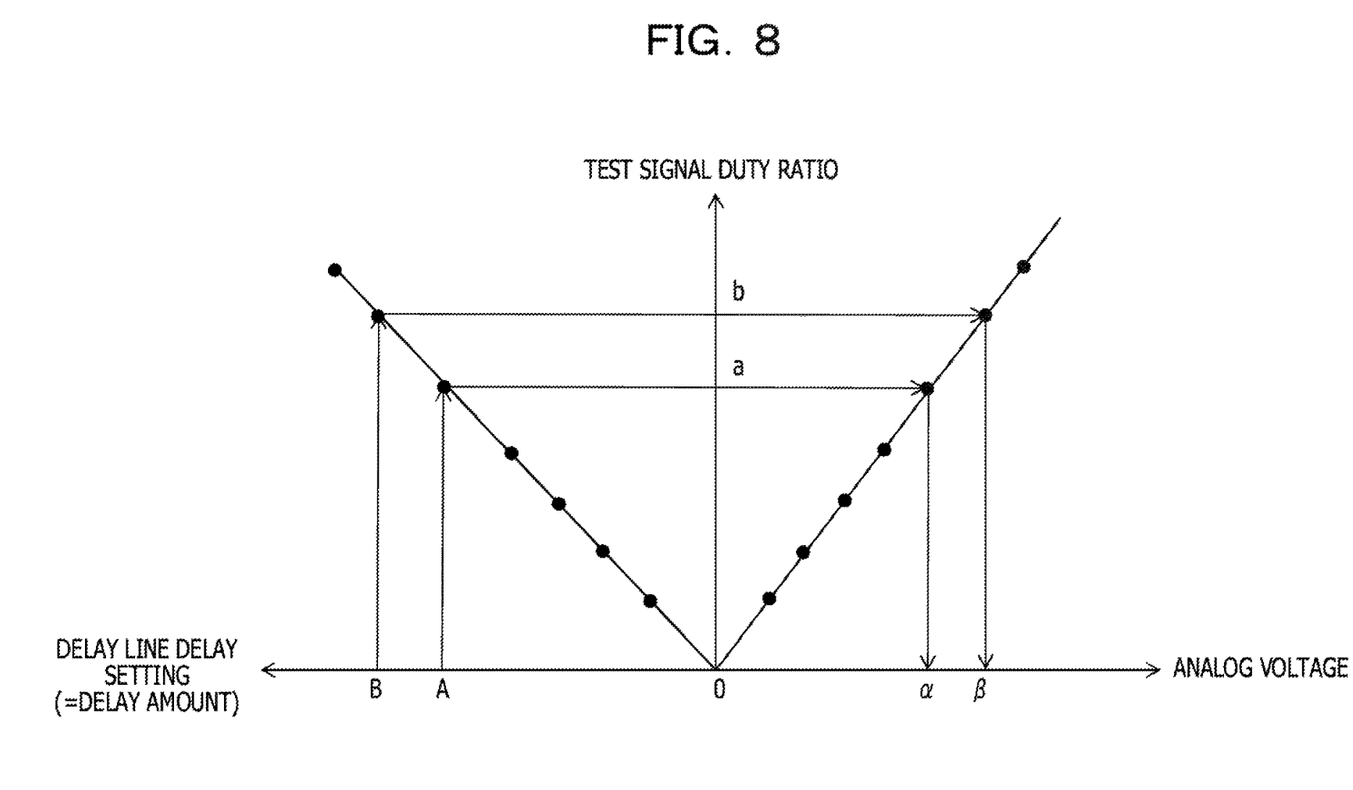
FIG. 8 is a diagram illustrating a relationship between a delay setting value (=delay amount) of the delay line, a duty ratio of a test signal, and voltage of an analog signal output from the integrator.

FIG. 8 is a diagram illustrating a relationship between a delay setting value (=delay amount) of the delay line, a duty ratio of a test signal, and voltage of an analog signal output from the integrator.

As FIG. 8 illustrates, the delay setting value (=delay amount) of the delay line is proportional to the duty ratio of the test signal, and the duty ratio of the test signal is also proportional to the voltage of the analog signal. Thus, the delay setting value (=delay amount) of the delay line is proportional to the voltage of the analog signal. For example, when "the delay line setting value of =A", "the test signal duty ratio=a" and "analog voltage=α", and when "the delay line setting value of=B", "the test signal duty ratio=b" and "analog voltage=β". Thus "A:B=a:b=α:β".

Figure 9A:
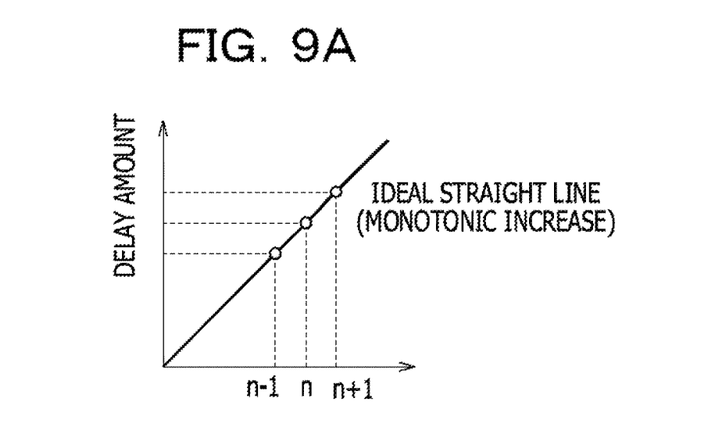
FIGS. 9A to 9D are diagrams each illustrating an example of a relationship between a delay line delay setting value and a measured delay amount, FIG. 9A illustrating a case with a normal delay line, and FIGS. 9B to 9D each illustrating a case with an abnormal delay line.

FIGS. 9A to 9D are diagrams each illustrating an example of a relationship between a delay line delay setting value and a measured delay amount. FIG. 9A illustrates a case with a normal delay line, and FIGS. 9B to 9D each illustrates a case with an abnormal delay line.

As illustrated in FIG. 9A, in the case of the normal delay line, when a delay line delay setting value increases one by one like n−1, n, and n+1, the delay amount also increases in proportion to the delay line delay setting value.

Figure 9B:
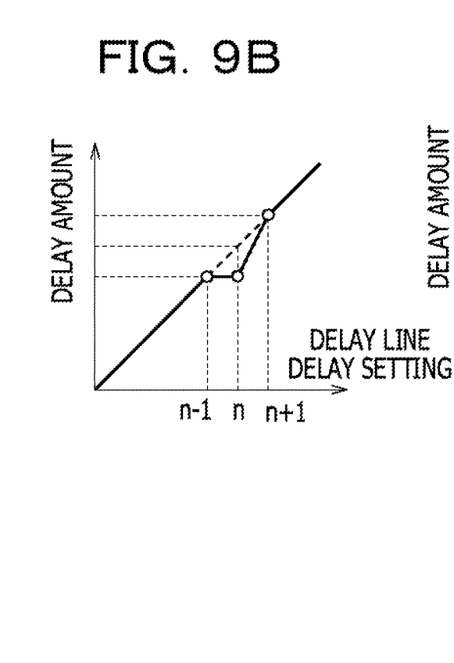

In FIG. 9B, the delay amount is the same as in FIG. 9A when the delay line delay setting value is n−1, but when the delay line delay setting value is n, an abnormality occurs in which the delay amount does not increase, remaining the same as for the delay line delay setting value n−1. Then, when the delay line delay setting value is n+1, the delay amount is the same as in FIG. 9A and normal, but has increased by two stage worth of amount from the amount under the delay line delay setting value n.

Figure 9C:
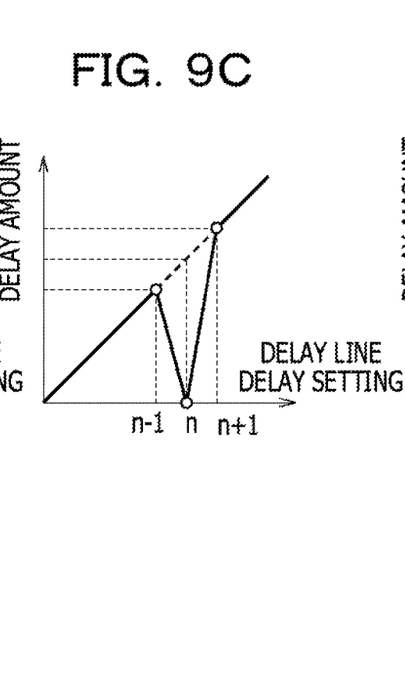

In FIG. 9C, the delay amount is the same as in FIG. 9A when the delay line delay setting value is n−1, but when the delay line delay setting value is n, an abnormity occurs in which the delay amount greatly drops to the same level as several stages before. When the delay line delay setting value is n+1, the delay amount is the same as in FIG. 9A and normal, but has greatly increased from the delay amount under the delay line delay setting value n.

Figure 9D:
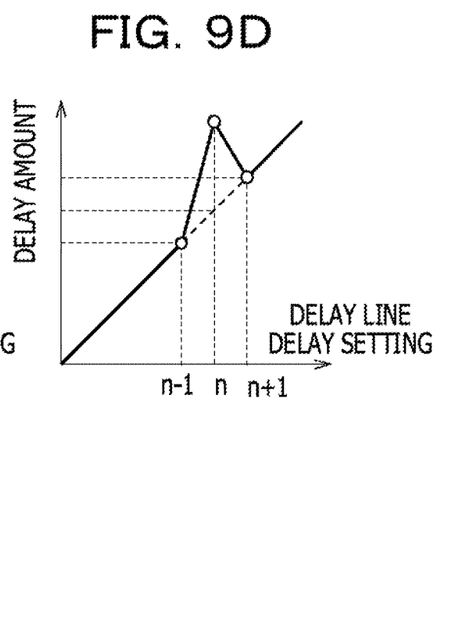

In FIG. 9D, the delay amount is the same as in FIG. 9A when the delay line delay setting value is n−1, but when the delay line delay setting value is n, an abnormality occurs in which the delay amount becomes large and greatly increases. When the delay line delay setting value is n+1, the delay amount is the same as in FIG. 9A and normal, but has greatly decreased from the delay amount under the delay line delay setting value n.

Figure 10A:
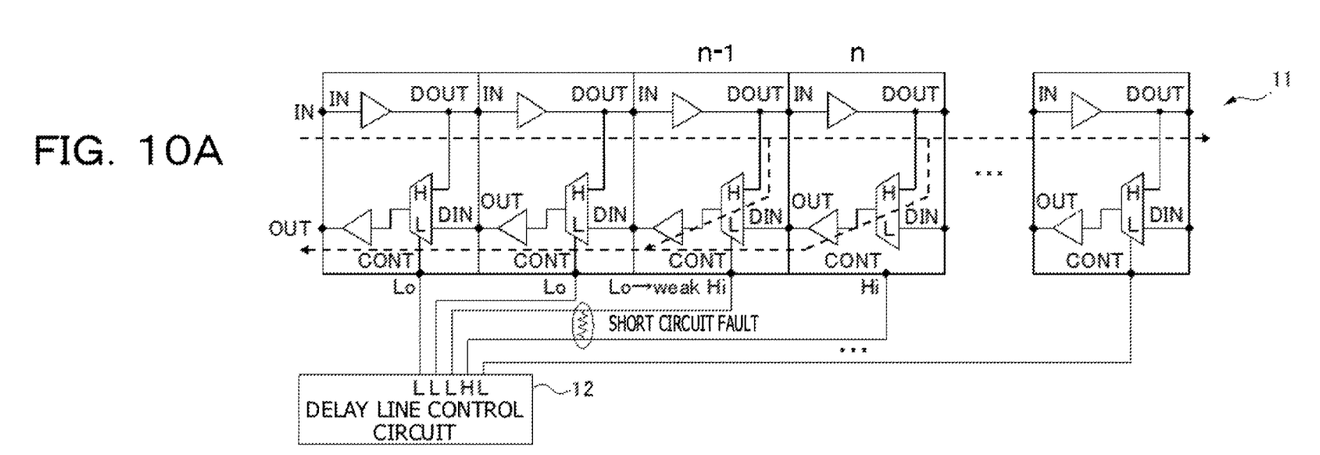
FIGS. 10A and 10B are diagrams respectively illustrating examples of faulty positions that caused failures illustrated in FIGS. 9B and 9C in the delay unit.
Figure 10B:
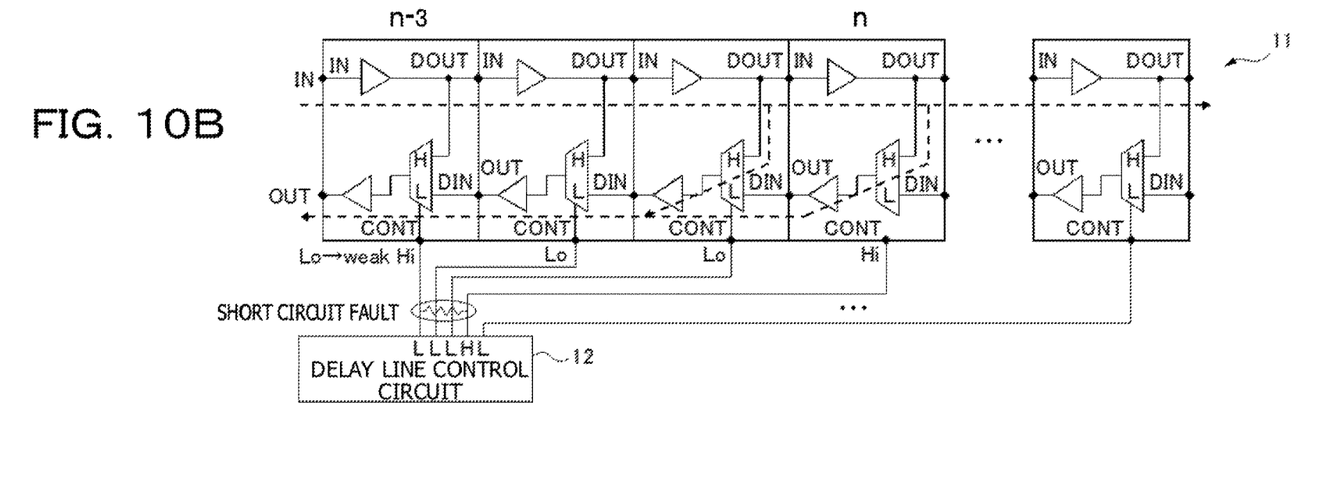
Figure 11:
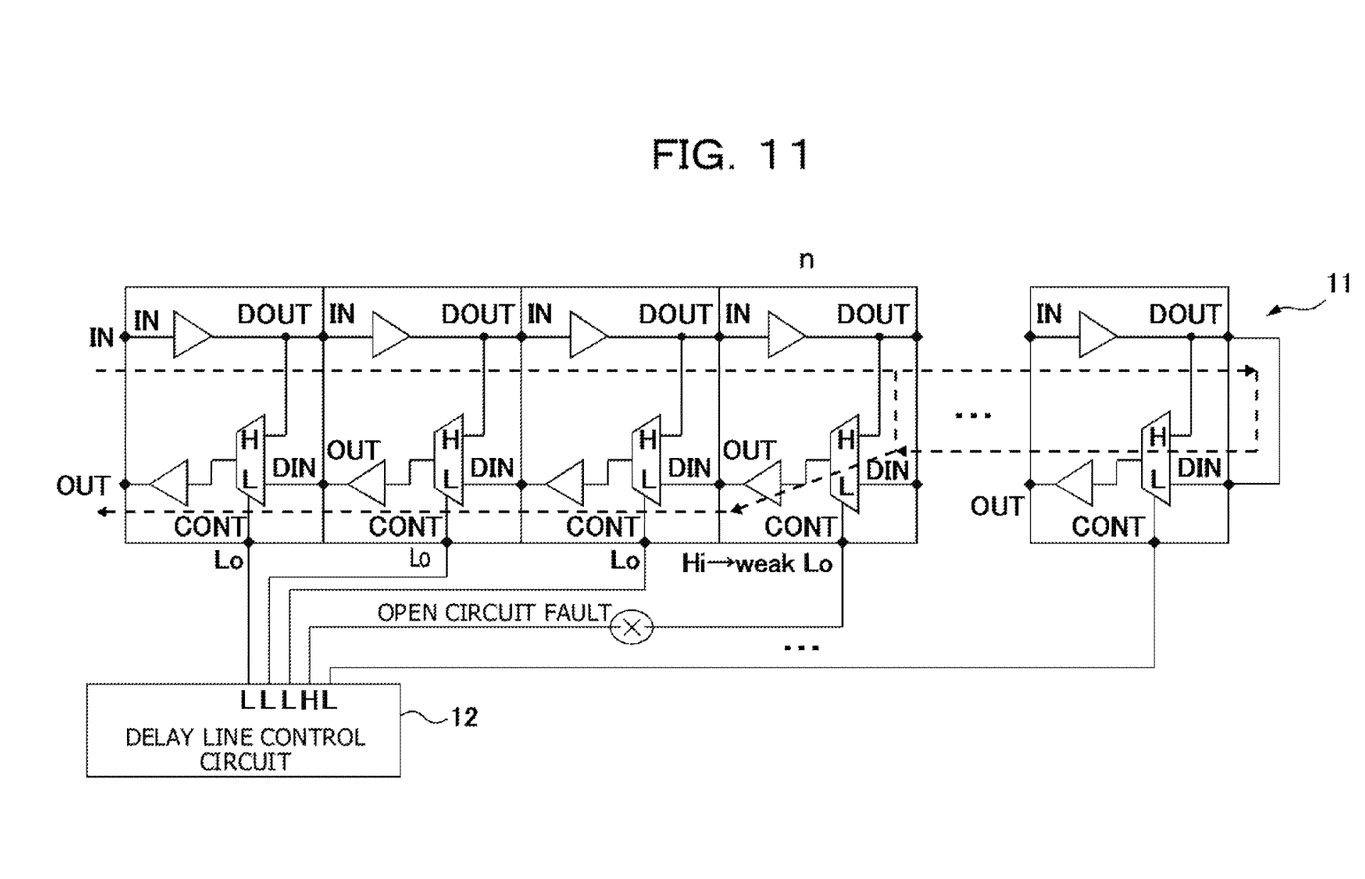
FIG. 11 is a diagram illustrating an example of faulty positions that caused the failure illustrated in FIG. 9D in the delay unit.

FIGS. 10A, 10B, 11 are diagrams respectively illustrating examples of faulty positions that cause failures illustrated in FIGS. 9B to 9D in the delay unit. FIG. 10A illustrates an example of a failure that causes the fault in FIG. 9B. In this example, adjacent wirings are short-circuited between the delay line control circuit 12 of the delay unit 10 and control signal CONT terminals of the delay line 11. If the short-circuited wirings are a wiring to a control signal CONT terminal of a delay element at the n−1th stage and a wiring to a control signal CONT terminal of a delay element at the nth stage, the delay amounts becomes the same regardless of whether the delay line delay setting value is n−1 or n. However, when a control signal CONT terminal of a delay element at another stage is selected and set to "H", a normal delay amount is obtained.

FIG. 10B illustrates an example of a failure that causes the fault in FIG. 9C. In this example, separated wirings are short-circuited between the delay line control circuit 12 of the delay unit 10 and control signal CONT terminals of the delay line 11. If the short-circuited wirings are a wiring to a control signal CONT terminal of a delay element at the n−3th stage and a wiring to a control signal CONT terminal of a delay element at the nth stage, the delay amounts becomes the same regardless of whether the delay line delay setting value is n−3 or n. However, when a control signal CONT terminal of a delay element at another stage is selected and set to "H", a normal delay amount is obtained.

FIG. 11 illustrates an example of a failure that causes the fault in FIG. 9D. In this example, open circuit (disconnection) occurs part way through a wiring from the delay line control circuit 12 of the delay unit 10 to a control signal CONT terminal of a delay element at the nth stage of the delay line 11. In this case, even when the delay element at the nth stage is selected as a feedback position, an input signal is not fed back at this stage, and is fed back at the last stage of the delay line, maximizing the delay amount. However, when a control signal CONT terminal of a delay element at another stage is selected and set to "H", a normal delay amount is obtained.

Note that, in the delay element 20 that forms a delay line, when an open circuit (disconnection) occurs in a portion other than the wiring to the "H" side of the selector, a delayed signal does not appear at all even when the relevant stage or a following stage is selected as a feedback position. However, the delay line functions normally up to the immediately preceding stage. In addition, when an open circuit (disconnection) occurs in the wiring to the "H" side of the selector, a change illustrated in FIG. 9D and similar to the failure of FIG. 11 will result. Furthermore, there may also be a failure such as the one in which a wiring from the delay line control circuit 12 to the control signal CONT terminal of the delay line 11 is short-circuited to GND or VCC.

The embodiments are described above, but various modifications may be implemented. For example, as configurations of the delay line and the delay line control circuit, other known configurations may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A test method of a delay circuit including a delay line that delays an input signal in accordance with a delay setting signal and performs output of the input signal as a delayed signal, and a logic circuit processes the input signal to the delay line and the delayed signal, the test method comprising:

inputting the delay setting signal to which a delay amount of the delay line is set, to the delay circuit;

inputting a test signal of a duty ratio having a large cycle as compared with twice a maximum delay amount of the delay line, to the delay line, as the input signal;

converting an output of the logic circuit into a voltage value by an integrator;

measuring the voltage value while changing setting of the delay amount of the delay line; and checking an operation of the delay circuit from the change in the voltage value and the set delay amount of the delay line, the wherein the logic circuit is one of a logical exclusive OR, a logical exclusive-NOR, a logical OR, a logical NOR, a logical AND, and a logical NAND.

2. The test method of the delay circuit according to claim 1, wherein the setting of the delay amount of the delay line is changed so that the delay amount of the delay line increases or decreases one by one on design, and the delay circuit is determined to be a non-defective product when the change in the delay amount of the delay line monotonically increases or decreases, and the change amount is a given value or less.

3. The test method of the delay circuit according to claim 1, wherein the delay line is formed by connecting a plurality of delay circuits in series.

4. The test method of the delay circuit according to claim 3, wherein each of the plurality of delay circuits includes a first buffer, a selector and a second buffer.

5. The test method of the delay circuit according to claim 4, wherein the first buffer delays an input signal from a preceding stage and outputs a first output signal to a following stage, and the selector selects one out of the first output signal output from the first buffer and a second output signal output from the following stage according to a control signal, and the second buffer delays the first output signal or the second output signal output from the selector and outputs a signal to the preceding stage.

6. The test method of the delay circuit according to claim 4, wherein each of the first buffer and the second buffer includes two inverters connected in series.

* * * * *